United States Patent
Ignjatovic et al.

(10) Patent No.: US 9,574,945 B2
(45) Date of Patent: Feb. 21, 2017

(54) THZ RADIATION DETECTION IN STANDARD CMOS TECHNOLOGIES BASED ON THERMIONIC EMISSION

(71) Applicant: University of Rochester, Rochester, NY (US)

(72) Inventors: Zeljko Ignjatovic, Rochester, NY (US); Hanan Dery, Rochester, NY (US)

(73) Assignee: University of Rochester, Rochester, NY (US)

( * ) Notice: Subject to any disclaimer, the term of this patent is extended or adjusted under 35 U.S.C. 154(b) by 0 days.

(21) Appl. No.: 15/067,521

(22) Filed: Mar. 11, 2016

(65) Prior Publication Data

US 2016/0305823 A1    Oct. 20, 2016

Related U.S. Application Data

(60) Provisional application No. 62/147,655, filed on Apr. 15, 2015.

(51) Int. Cl.
  *G01J 5/00*    (2006.01)
  *G01J 5/08*    (2006.01)
  *H01L 31/112*  (2006.01)
  *G01J 5/22*    (2006.01)
  *G01J 5/20*    (2006.01)
  *G01J 5/10*    (2006.01)

(52) U.S. Cl.
  CPC ............ *G01J 5/0837* (2013.01); *G01J 5/00* (2013.01); *G01J 5/20* (2013.01); *G01J 5/22* (2013.01); *H01L 31/112* (2013.01); *G01J 2005/106* (2013.01)

(58) Field of Classification Search
  CPC .................................. G01J 5/00; G01J 5/20
  USPC ...................................... 250/338.1
  See application file for complete search history.

(56) References Cited

PUBLICATIONS

Dayalu et al. (Terahertz Detection in Si MOSFET based Thermionic Emission, IEEE International conference on Microwaves, Communications, Antennas and Electronic Systems (COMCAS 2015) Nov. 2-4, 2015, Tel Aviv, Israel.*

* cited by examiner

*Primary Examiner* — David Porta
*Assistant Examiner* — Meenakshi Sahu
(74) *Attorney, Agent, or Firm* — Cooper & Dunham LLP

(57) ABSTRACT

A detector of terahertz (THz) energy includes a MOSFET having an extended source region, and a channel region depleted of free carriers, which MOSFET operates in a sub-threshold voltage state and has an output that is an exponential function of THz energy supplied to the gate.

20 Claims, 8 Drawing Sheets

THZ RADIATION DETECTION IN STANDARD CMOS TECHNOLOGIES BASED ON THERMIONIC EMISSION

CROSS REFERENCE TO RELATED APPLICATIONS

This application claims the priority of U.S. Provisional Application No. 62/147,655, filed Apr. 12, 2015, the disclosure of which is incorporated herein by reference in its entirety.

FIELD

This patent specification pertains to detection of teraherz (THz) radiation and more specifically to detecting THz energy using an operating regime of semiconductor devices such as CMOS transistors that conventionally is called the OFF (non-conducting) state, and to utilizing such detection in imaging, communications, and other fields.

BACKGROUND

Several references, cited at the end of this patent specification, are identified by numbers in square brackets in the description below and are hereby incorporated by reference.

THz radiation typically denotes electromagnetic energy in an ITU-designated band of frequencies from 0.3 to 3 terahertz (1 THz=$10^{12}$ Hz) and wavelengths ranging from 1 mm to 0.1 mm (100 μm). This is a range between microwaves and infrared light, and shares some properties with each. Like infrared and microwave radiation, THz radiation is understood to travel in a line-of-sight and to be non-ionizing, which makes it safer for biological tissue. Like microwave radiation, THz radiation can pass through some non-conducting materials such as clothing, paper, cardboard, wood, masonry, plastic, and ceramics. THz radiation can be modulated by differences in water content and density of tissue and therefore can be used for imaging. Some materials of interest in various fields, including security, have spectral "fingerprints" in the THz range, which opens prospects for combining spectral identification with imaging. The short wavelength of THz radiation can contribute to high spatial resolution in imaging and to high bandwidth in communications.

Despite such potential advantages of THz radiation, progress in utilizing it has been hindered by difficulties in detecting such radiation. Known THz detectors include pyroelectric sensors, Schottky barrier diodes, and GaAs field-effect transistors. The known detectors have limitations such as low sensitivity, slow speed, requirements for cryogenic cooling, and difficulty scaling to array formats suitable for THz imaging. Proposals have been made for using CMOS transistors but in modes that suffer from low efficiency particularly at higher frequencies. Infrared focal plane arrays (FPAs) have been proposed for THz imaging experiments but the detection efficiency is believed low, typically less than 5%. Researchers have explored metamaterial (MM) devices, which are sub-wavelength elements in which their structure rather than their composition dominates their electromagnetic properties. MMs have been proposed for creating resonant absorber structures. Plasmonic devices have been proposed for use in surface plasmon resonance (SPR), where incident light resonantly couples with surface plasmons at a metal/dielectric interface.

The challenge of discovering efficient and effective THz detectors has remained for a long time. This patent specification is directed to meeting that challenge and providing advantageous systems utilizing novel THz detectors.

SUMMARY OF THE DISCLOSURE

The examples of new THz detectors described in this patent specification unexpectedly demonstrate that in certain structural conditions and under sub-threshold biasing conditions (or weak inversion), semiconductor devices such as MOSFETs can exhibit dramatic increases in responsivity to THz radiation. According to current understanding, it is believed that under sub-threshold biasing conditions and with the correct structure, the plasmonic detection of signals in THz frequency range in a MOSFET becomes negligible compared to the detection from thermionic emission (TE) through a potential barrier between a highly-doped source region and depleted channel, as described below. The detection current due to TE has been found to be a much stronger function of the applied THz signal (exponential dependence) than the detection current due to plasmonic rectification in the channel alone (a square-law dependence), and with properly extended source regions in accordance with some of the embodiments described in more detail below, a MOSFET in a weak inversion can exhibit much improved responsivity to the THz radiation.

The novel structure and operation of THs detectors described in this patent specification find application in diverse fields such as THz imaging of biological and non-biological objects, spectral analysis of materials, and communications.

DETAILED DESCRIPTION OF PREFERRED EMBODIMENTS

Figure 1A:
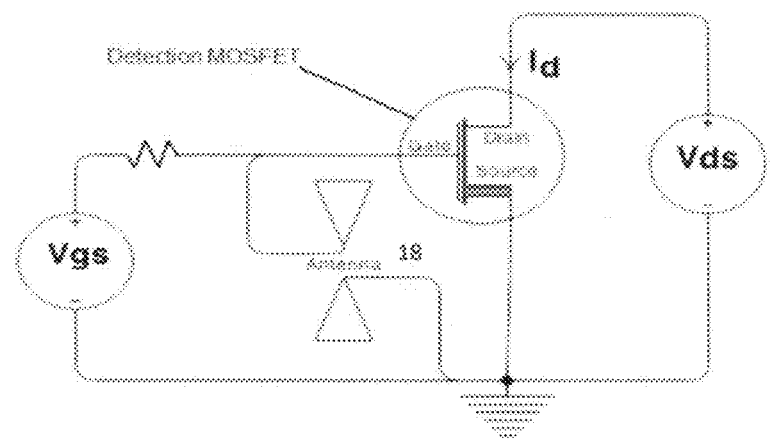
FIG. 1a is a schematic diagram of a MOSFET in common-source topology for use in THz radiation detection.
Figure 1B:
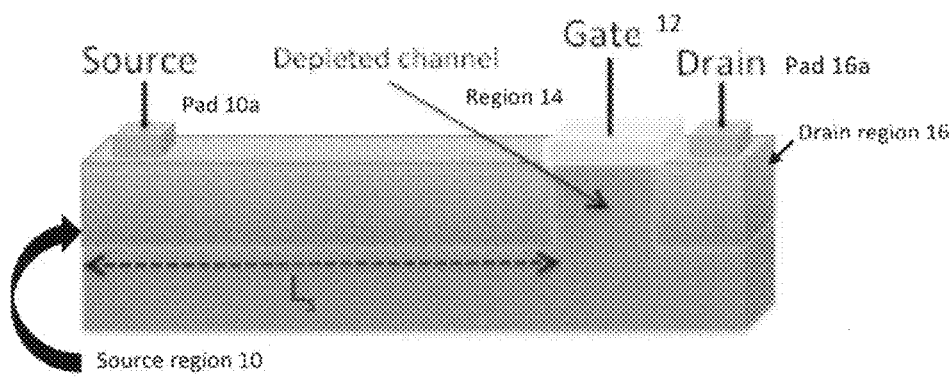
FIG. 1b illustrates in perspective a MOSFET with an extended source region operating in a weak inversion mode for thermionic detection of THz radiation.

FIG. 1a illustrates a simplified schematic of a pixel for detecting THz energy that can be referred to as a THz signal. In accordance with some of the disclosed embodiments, the device in this example comprises a MOSFET (metal oxide semiconductor field effect transistor) implemented as an NMOS transistor that has an otherwise typical or standard structure but notably has an extended source region 10 that has a length Ls as illustrated in FIG. 1b, which has a significantly greater dimension than in a standard MOSFET. The biasing voltage $V_{gs}$ between gate 12 and source pad 10a is kept below the threshold voltage $V_t$ or $V_{th}$ of the transistor so that the channel region 14 is depleted of free carriers and forms a depleted channel acting as a potential barrier at the source-channel boundary (i.e., the height of the potential barrier is set by the biasing voltage $V_{gs}$). The drain-source voltage $V_{ds}$ between drain region 16 and source region 10 is maintained high enough so that the drain pad 16a may efficiently capture electrons escaping the source-channel barrier. A half-wavelength bow-tie antenna 18 is connected as illustrated in FIG. 1a, one to the gate and the other to the source of the MOSFET. Depending on the imaging application, other antenna designs could be used as well such as simple half-wavelength dipole, log-spiral, and linear spiral antenna.

Figure 1C:
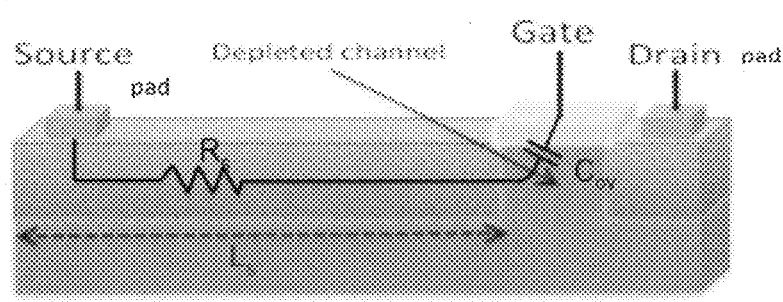
FIG. 1c illustrates in perspective a lumped-element small-scale model of the MOSFET of FIG. 1b.

As illustrated in FIG. 1c, the lumped-element small-signal model of the transistor illustrated in FIG. 1b can be considered as comprising a resistor Rs representing source region 10 and connected between source pad 10a and a capacitor $C_{ov}$ including gate oxide overlap capacitance and gate-to-source fringe capacitances and has its other side connected to the gate pad 12a.

As known in transistor technology, a depletion region is formed from a conducting region by removing free charge carriers. For an enhancement-mode, n-channel MOSFET, when the gate-to-source voltage $V_{gs}$ is less than the transistor's threshold voltage $V_{th}$, it can be said that the transistor is in a cutoff, sub-threshold, or weak-inversion mode. A more accurate model can consider the effect of thermal energy on the distribution of electron energies allowing some of the more energetic electrons at the source to enter the channel and flow to the drain. While the current between drain and source would ideally be zero when the transistor is being used as a turned-off switch, there actually is a weak-Inversion current, sometimes called sub-threshold leakage, which is known to vary with changes in steady gate voltage. It had been believed that THz frequencies applied to the gate of a typical, standard MOSFET would oscillate at too high a rate to allow charge carrier transport that would predictably change channel current.

This patent specification proposes an explanation or theory of why the new device geometry and operation allow useful detection of THz radiation but it should be understood that it is not a limitation on the structure and operation of the novel devices and circuits described herein and that future developments in science may change the proffered explanation or theory and even prove it incorrect.

According to current understanding, in the example of FIGS. 1a and 1b THz energy absorbed by the antenna(s) generates electron charge oscillations at the gate of the NMOS device. The resulting electric field couples to both the depleted channel and to the source region through the gate oxide capacitance. The dielectric relaxation time and relaxation frequency of the p-type substrate in a typical CMOS process with doping density of $10^{16}$ cm$^{-3}$ are 2 ps and 80 GHz, respectively. As the relaxation frequency of the p-type substrate is much lower than the typical THz radiation frequency, the energy bands in the depleted channel along with the potential barrier on the channel side are not significantly affected by the THz signal absorbed by the antenna. On the other hand, the source region with typical doping levels $N_d$ from $10^{18}$ to $10^{19}$ cm$^{-3}$ and mobility $\mu_n$=100 cm$^2$Ns ensures that the charge carriers (electrons) in such a highly doped region are much faster and have a typical relaxation frequency of about 20 THz. Hence the electron density at the source boundary can track and screen the changes in the high-frequency electric field originated at the gate electrode. As a result, an electron charge accumulates at the source boundary and the resulting potential is virtually linearly proportional to the applied electric field. This change in the potential affects the height of the potential barrier and also affects the TE current exponentially. If the THz signal at the gate electrode is $V_{thz}(t) = V_0 \cos(\omega_0 t)$ the average TE current or the detection current ($I_d$) can be calculated as shown in (1):

$$I_d = \left\langle I_s e^{\frac{V_{GS}}{V_T}} e^{\sqrt{1+(\omega_0 R_s C_{ov})^2}} \frac{V_0 \cos(\omega_0 t)}{V_T} \right\rangle = I_D J_0 \left( j \frac{\omega_0 R_s C_{ov}}{\sqrt{1+(\omega_0 R_s C_{ov})^2}} \frac{V_0}{V_T} \right) \quad (1)$$

The symbol $\langle . \rangle$ indicates time average. $V_T$ is the thermal voltage equal to kT/q where k is the Boltzmann constant, T is the temperature, and q is the electron charge. $R_s$ is the resistance of the source region, proportional to the source length $L_s$, $$\left( R_s = \frac{L_s}{q N_D \mu_n A_s} \right),$$

where $A_s$ is the cross-sectional area of the source/channel boundary. $C_{ov}$ is the gate-to-source overlap capacitance. $I_D$ is the detector biasing current and $J_0(jx)$ is the zero order Bessel function of the first kind. $I_s$ is the thermionic emission current over the source-channel barrier for zero gate voltage as shown in equation (2), where $N_A$ is the channel doping density, $n_i$ is the intrinsic density, and $m^*_e$ is the electron effective mass.

$$I_s = qA_s\sqrt{\frac{2kT}{\pi m_e^*}} \frac{n_i^2}{N_A} \quad (2)$$

It is seen from Eq. (1) that thermal emission detection current $I_d$ depends exponentially on the amplitude of the THz signal, which is a much stronger function than the quadratic dependence (or linear with power) seen in a MOSFET under strong inversion used in THz detectors using plasmonic mode of detection. The TE detection method also makes a novel use of the device geometry by extending the source region of the MOSFET. Typical values of $R_s$ and $C_{ov}$ for a detection MOSFET with W=2 μm, L=0.35 μm, and $L_s$=1 μm in 0.35 μm CMOS technologies are 0.2-1 kΩ and 0.5 fF, respectively. This indicates that the $\omega_0 R_s C_{ov}$ term in (1) is smaller than one for sub-terahertz frequencies (0.2–1 THz). Increase in $L_s$ means a corresponding increase in $R_s$ and this leads to a larger detection current.

Figure 2:
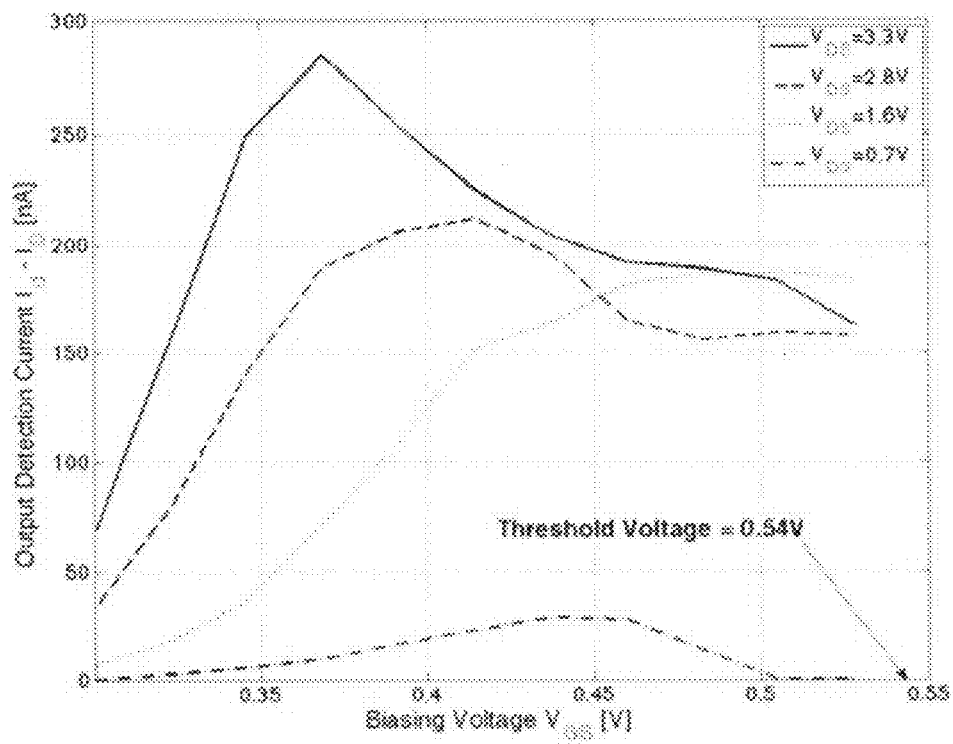
FIG. 2 illustrates graphs of detection current vs. gate-to-source voltage of a MOSFET THs radiation detector according to some embodiments.

FIG. 2 illustrates a measured difference between the detection current $I_d$ due to the THz signal and the biasing current $I_D$ as a function of the biasing voltage $V_{GS}$ for different drain potential $V_{DS}$ of a MOSFET such as in FIG. 1a, indicating a strong response in deep sub-threshold and higher amplitude of the response with higher drain potentials.

Figure 3:
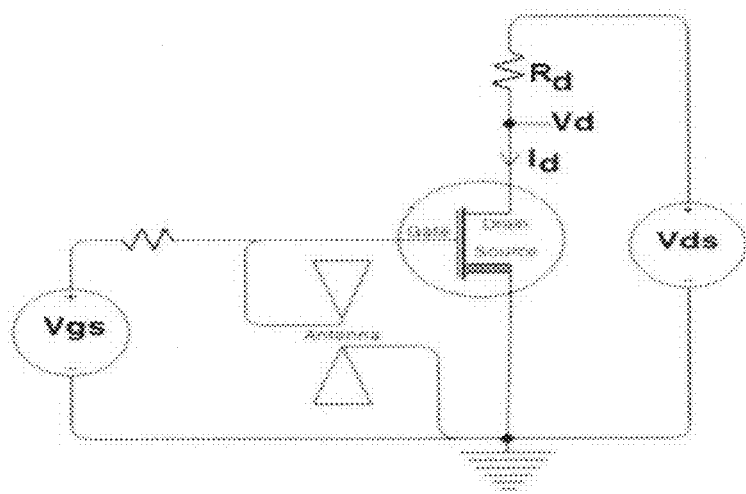
FIG. 3 is a schematic diagram of a MOSFET THs detector in a circuit with current-to-voltage conversion through a linear resistor according to some embodiments.

The conversion gain of TE (thermionic emission) THz detection in accordance with embodiments of this patent specification has been found to be greatly superior to plasmonic detection in strong inversion. In practical CMOS implementations, the detection current $I_d$ can be measured directly or, which is more practical, it can be converted and read out as voltage $V_d=Z(I_d-I_D)$, where Z is the detection transimpedance. The current-to-voltage conversion can be implemented through a linear resistor $R_d$ as shown in FIG. 3 ($Z=R_d$), where the output voltage $V_d$ can be measured at the node labeled $V_d$, or through an integration capacitance $C_{INT}$ (described herein as a "photo-voltaic" readout mode and shown in FIGS. 7-8), where $Z=t_{int}/C_{INT}$. The conversion gain of the TE THz detection can then be calculated as in Eq. (5), where $J_1(x)$ is the first-order Bessel function of the first kind:

$$\frac{dV_d}{dV_0} = ZI_D \frac{d}{dV_0}\left(J_0\left(j\frac{H(\omega_0 R_s C_{ov})V_0}{V_T}\right)\right) = \quad (5)$$
$$-jZI_D \frac{H(\omega_0 R_s C_{ov})}{V_T} J_1\left(j\frac{H(\omega_0 R_s C_{ov})V_0}{V_T}\right)$$

On the other hand, as discussed in references [3] and [4], in the case of plasmonic detection in the MOSFET channel under strong inversion ($V_{gs}>V_t$, where $V_t$ is the MOSFET's threshold voltage), the detected voltage $V_d$ at the drain output is proportional to the THz signal power as shown in Eq. (6), and the conversion gain for this case is shown in Eq. (7):

$$V_d \propto \frac{V_0^2}{V_{gs}-V_t} \quad (6)$$

$$\frac{dV_d}{dV_0} \propto \frac{2V_0}{V_{gs}-V_t} \quad (7)$$

Figure 4A:
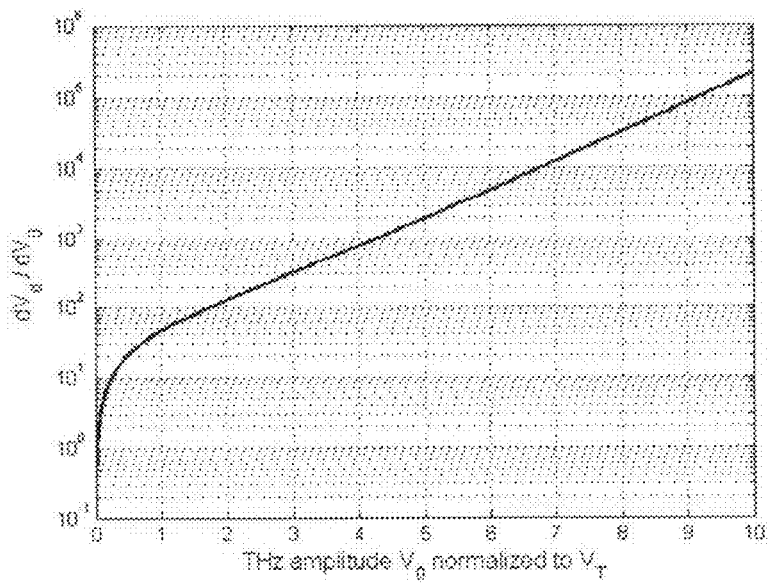
FIG. 4a illustrates a graph of conversion gain as a function of applied THz amplitude normalized to the thermal voltage for thermionic (TE) mode of THz detection in a MOSFET according to some embodiments.
Figure 4B:
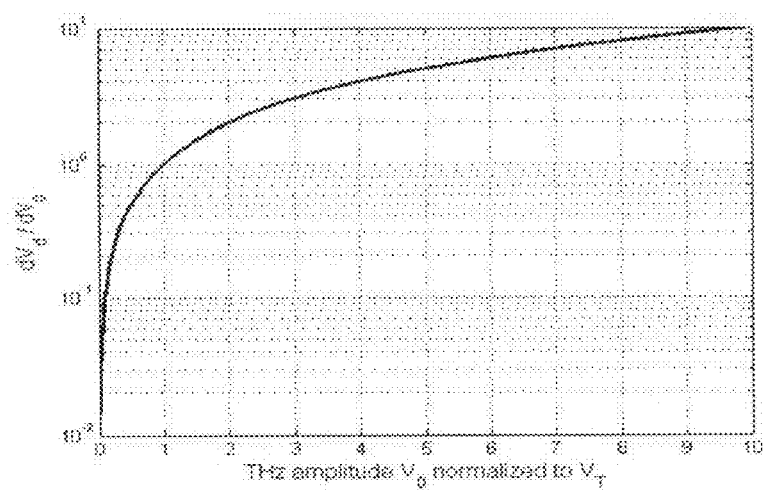
FIG. 4b illustrates a similar graph but for plasmonic detection.

FIGS. 4a and 4b compare the conversion gain $dV_d/dV_0$ as a function of the applied THz amplitude $V_0$ in both cases. It is assumed that the MOSFET is biased at a typical value of 50 mV above $V_t$ for the plasmonic detection mode. From FIGS. 4a and 4b, we see that the conversion gain of the thermionic emission (TE) mode is a much stronger function (approximately exponential) of the applied THz amplitude $V_0$ than in the case of plasmonic detection, which indicates TE's better responsivity in detecting THz radiation. In this example, the conversion gain for TE mode in accordance with embodiments disclosed in this specification ranges up to about $10^6$ while for the plasmonic mode it ranges only up to about $10^1$.

Figure 5:
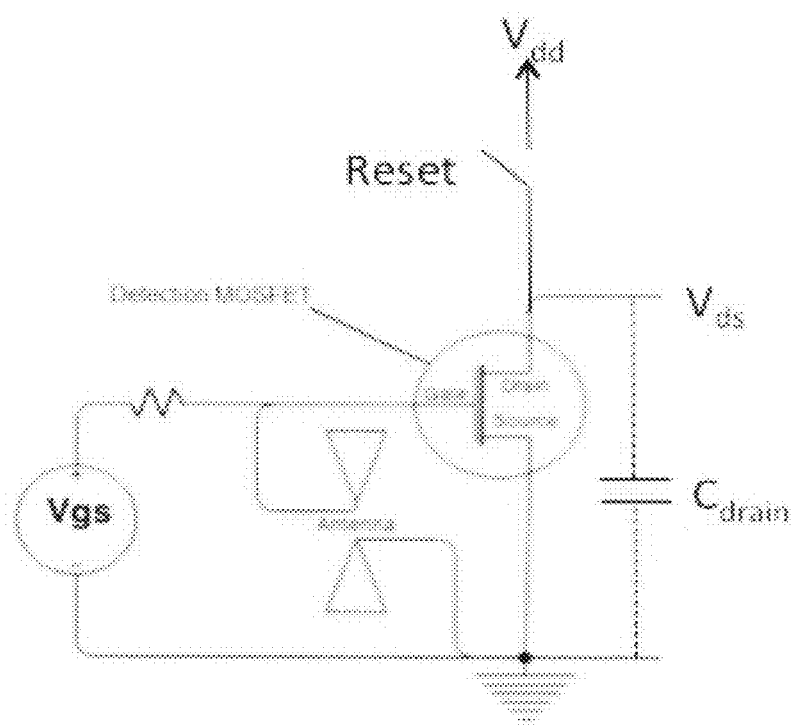
FIG. 5 is a schematic diagram of a MOSFET THs detector in a circuit for photo-voltaic TE detection of THz energy according to some embodiments.

Photo-Voltaic Readout Mode for TE detection of THz radiation is discussed next. An important feature of the TE detection according to this patent specification is that it allows practical "photo-voltaic" (PV) operation that can be otherwise similar to the readout methods in standard visible-wavelength image sensors but operates at THz frequencies. In the TE detection mode, the detection current $I_d$ is repeatedly integrated onto a drain capacitance $C_{INT}$ (e.g., $C_{drain}$ in FIG. 5) for time periods $t_{int}$ (integration times) after each of which it can be read out as a voltage. A schematic diagram of a MOSFET for PV mode of detection is illustrated in FIG. 5. At the beginning of an integration time period $t_{int}$, the drain node capacitance $C_{drain}$ is briefly reset to a high potential (e.g., power supply voltage $V_{dd}$) by closing the switch labeled "reset." After the reset operation, the drain node is disconnected from the power supply voltage by opening switch "reset" and electrons escaping the barrier between the source and channel regions during the integration time tin will accumulate on the node labeled $V_{ds}$ lowering its potential. The resulting output signal $V_d$ is shown in Eq. (8). Notably, even in the absence of a THz signal, the output voltage would drop below $V_{dd}$ due to the biasing current $I_D$ alone, which reduces the allowed voltage swing at the output and the dynamic range. For this reason, the PV mode is impractical in the case of plasmonic detection in strong inversion since it requires a significant biasing current $I_D$, which would quickly saturate the drain capacitance even in the absence of the THz signal, but is has been discovered to be practical for the TE mode described in this patent specification:

$$V_d = V_{dd} - \frac{I_d t_{int}}{C_{drain}} = V_{dd} - \frac{t_{int}}{C_{drain}} I_D J_0\left(j\frac{\omega_0 R_s C_{ov}}{\sqrt{1+(\omega_0 R_s C_{ov})^2}} \frac{V_0}{V_T}\right) \quad (8)$$

Figure 6:
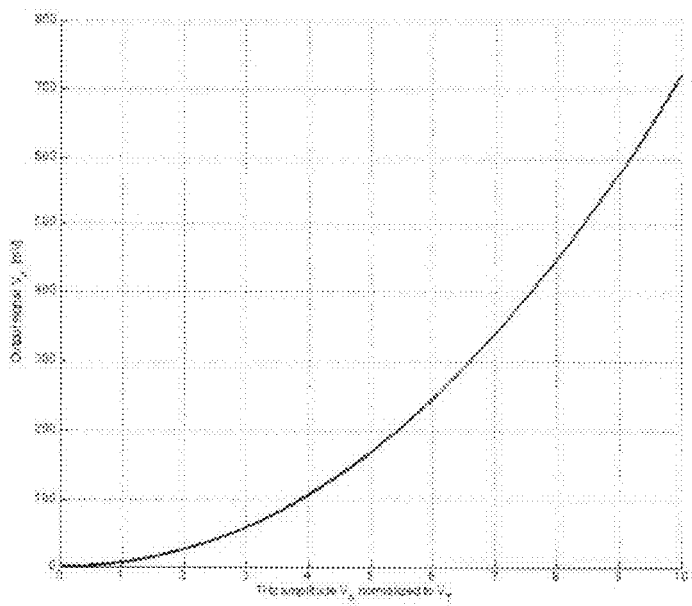
FIG. 6 illustrates a graph of an output signal $V_d$ as a function of the THz signal amplitude for the biasing conditions and process parameters set forth in Table 1 in the specification according to some embodiments.

FIG. 6 depicts the output voltage $V_d$ as a function of the THz signal amplitude $V_0$ normalized to the thermal voltage $V_T$ for the example of biasing conditions and CMOS process parameters in TE mode according to this patent application set out in Table 1 below:

TABLE 1

Example of biasing conditions and CMOS process parameters

| $N_D$ [cm$^{-3}$] | $N_A$ [cm$^{-3}$] | $\omega_0$ | $R_s$ [Ω] | $C_1$ [fF] | $V_{gs}$ [V] | $V_{FB}$ [V] | $C_{drain}$ [fF] | W [µm] | L [µm] | $t_{int}$ [ms] | γ [%] |
|---|---|---|---|---|---|---|---|---|---|---|---|
| $10^{18}$ | $10^{15}$ | 200 GHz | 200 | 0.5 | 0.47 | 0.14 | 50 | 2 | 0.35 | 0.1 | 30 |

Figure 7:
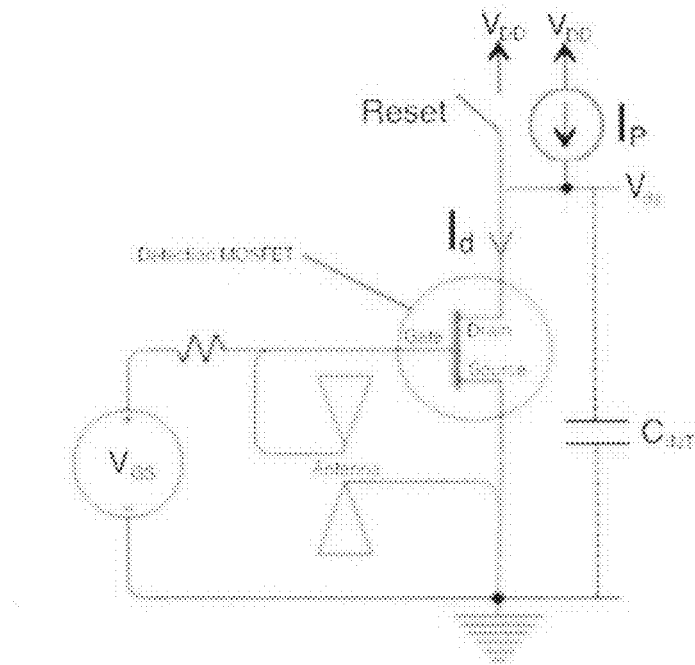
FIG. 7 is a schematic diagram of a MOSFET detector for photo-voltaic TE detection with increased dynamic range according to some embodiments.
Figure 8:
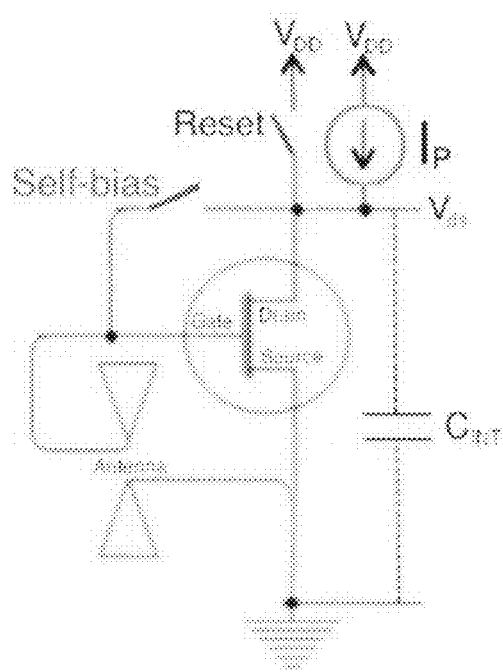
FIG. 8 illustrates a self-biasing scheme for a MOSFET detector for photo-voltaic TE detection with increased dynamic range according to some embodiments.

In another embodiment, illustrated in FIG. 7, a constant current source $I_P$ provides additional current to the drain node that is equal to (or close to) the biasing current $I_D$ but with the opposite sign. This arrangement can remove or reduce the voltage swing loss due to the biasing current. In this case the output voltage is given in Eq. (9). In the absence of a THz signal the second term in Eq. (9) is equal to zero or is very small, which indicates that a larger voltage swing can be allocated to the THz signal and/or that a much higher conversion gain ($t_{int}/C_{INT}$) can be used:

$$V_d = V_{dd} - \frac{(I_d - I_P)t_{int}}{C_{INT}} = V_{dd} - \frac{t_{int}}{C_{INT}} I_D \left( J_0 \left( j \frac{\omega_0 R_s C_{ov}}{\sqrt{1+(\omega_0 R_s C_{ov})^2}} \frac{V_0}{V_T} \right) - 1 \right) \quad (9)$$

Process variation in manufacturing CMOS devices and temperature variations in their use might interfere with matching between the current $I_P$ provided by the constant current source and the detector's biasing current $I_D$ (set by $V_{GS}$). Such mismatch may be even more pronounced between different pixels of a THz detector array comprising plural individual THz detectors such as the detector of FIG. 1b, resulting in an increased response non-uniformity and fixed pattern noise. To remedy such a matching challenge, a self-biasing scheme can be used such as in the example of FIG. 8. In this embodiment, the gate and drain terminals of the MOSFET are briefly shorted together through a switch labeled "self-bias" before a reset operation by the switch labeled "reset" operating as in FIGS. 5 and 7. As a result, a gate-to-source voltage is established so that the detector's biasing current is equal to the current $I_P$ provided by the constant current source. This voltage is stored at the gate's parasitic capacitance and should remain sufficiently unchanged during subsequent readout phases (Integration time intervals). The self-biasing phase ends by opening the gate-to-drain switch labeled "self-bias," which is then followed by the reset operation and the integration phase similar to the PV mode described above.

The PV mode of THz detection in the TE mode of a MOSFET provides three important benefits over plasmonic detection in the channel. First, it allows a much higher and better-controlled detection transimpedance Z in typical CMOS technologies (i.e., $t_{int}/C_{INT} \gg R_d$). Second, it permits a straightforward control over the SNR (signal-to-noise ratio) by adjusting the integration time t (i.e., the signal power increases with $t^2_{int}$ while the noise power increases linearly with $t_{int}$). Third, since the biasing current $I_D$ of the MOSFET in weak inversion (TE mode of detection) is typically much smaller than the basing current in strong inversion (plasmonic detection), its flicker (1/f) noise is negligible and much smaller than in plasmonic detection mode. The dominant noise in the PV mode of detection can be the shot noise of the biasing current $I_D$, as described below.

Figure 9:
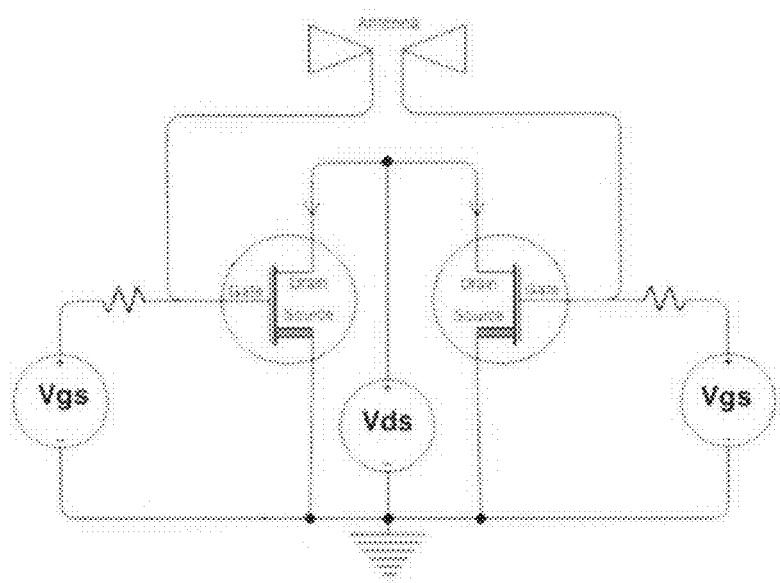
FIG. 9 illustrates a dual MOSFET photo-voltaic detector for TE THz detection according to some embodiments.

Since the average detection current in a TE mode MOSFET detector does not depend on the phase of the applied THz signal, the PV readout mode allows a straightforward implementation of a dual (or symmetric) THz detector as in FIG. 9. Due to the symmetry, this topology allows better antenna-to-detector impedance matching and further increase in responsivity. Similarly, the PV readout mode in a TE MOSFET detector provides straightforward means for implementing pixel binning (combining outputs from multiple pixels) in THz image sensing applications, an important feature for adjustable imaging resolution and on-chip analog signal processing.

Responsivity and Noise-Equivalent-Power of TE mode of THz detection are discussed next. The equivalent input impedance $Z_{in}$ of the MOSFET detector in the TE mode can be calculated from its lumped-element model shown in FIG. 1c, as shown in Eq. (10):

$$Z_{in} = \frac{1 + j\omega_0 R_s C_1}{j\omega_0 C_1} \quad (10)$$

For a given THz excitation signal at the gate $v_{tgz}(t) = V_0 \cos(\omega_0 t)$, the average power $P_{MOSFET}$ absorbed by the MOSFET device is then equal to:

$$P_{MOSFET} = \frac{V_0^2}{2R_s} \frac{(\omega_0 R_s C_1)^2}{1+(\omega_0 R_s C_1)^2} = \frac{V_0^2}{2R_s} H^2(\omega_0 R_s C_1) \quad (11)$$

If the antenna impedance is matched to the MOSFET input impedance, the responsivity R can then be calculated as $$R = \left\langle \frac{\gamma V_d}{2 P_{MOSFET}} \right\rangle,$$

where $\langle . \rangle$ is the average over $V_0$ range, and y is the antenna radiation collection efficiency ranging from 0 to 1 depending on the antenna geometry, wavelength, and loses in the material. If the biasing conditions and process parameters from Table 1 above are assumed, the responsivity of the PV mode MOSFET detector is calculated to be around 50 kV/W.

Noise in TE mode MOSFET for THz detection is discussed next. In the TE (or subthreshold) mode of MOSFET operation, there are several independent noise sources: shot noise from the detection current $I_d$, Johnson (or thermal noise) from the scattering in the source and depleted channel regions, and flicker (or 1/f) noise due to surface traps in the channel region. For small signal levels ($V_0 \approx 0$) the noise is dominated by the shot noise of the biasing current $I_D$. For the PV mode of THz detection, the output RMS noise voltage $V_{n\_RMS}$ due to the biasing current shot noise is calculated as in Eq. (12):

$$V_{n\_RMS} = \frac{\sqrt{qI_D t_{int}}}{C_{drain}} \quad (12)$$

For the parameters in Table 1 above, the output RMS noise voltage is equal to 2.4 mV$_{rms}$ resulting in an input referred noise power of 16 nW (or NEP=(16 nW) $\sqrt{t_{int}}$=160 pW/$\sqrt{\text{Hz}}$). It can be shown that the NEP is inversely proportional to $\sqrt{I_D}$ and it does not depend on the detection transimpedance Z, as shown in Eq. (13):

$$NEP = \lim_{V_0 \to 0} \frac{V_{n,RMS}}{R} \sqrt{t_{int}} = \frac{V_T^2 \sqrt{q}}{\gamma R_s \sqrt{I_D}} \lim_{V_0 \to 0} \frac{\frac{V_0^2 H^2}{V_T^2}}{J_0\left(j\frac{HV_0}{V_T}\right) - 1} = \frac{4V_T^2 \sqrt{q}}{\gamma R_s \sqrt{I_D}} \quad (13)$$

Figure 10:
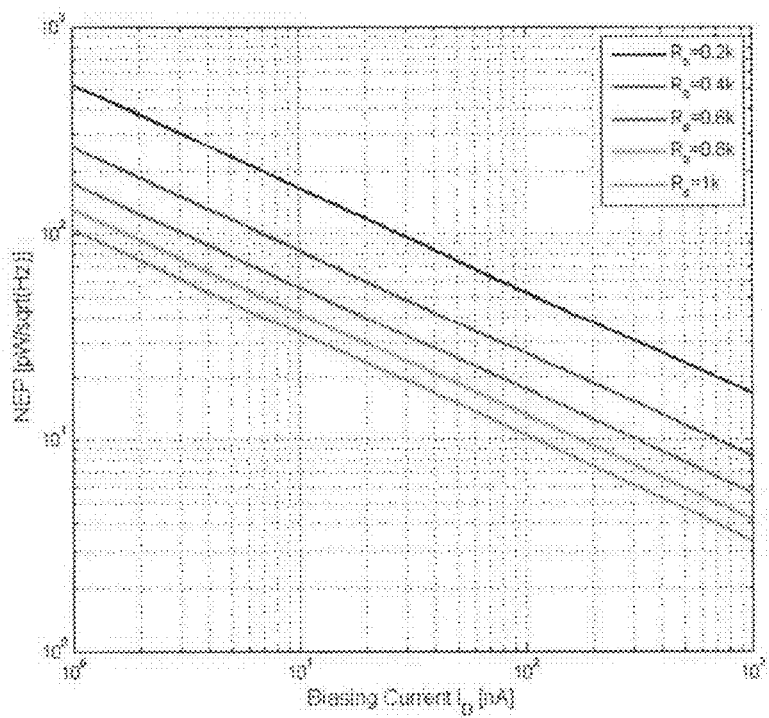
FIG. 10 illustrates Noise-Equivalent-Power as a function of the biasing current in for source region resistance values from 2000 to 1 kΩ according to some embodiments.

FIG. 10 illustrates the NEP as a function of the biasing current $I_D$ for source resistance values $R_s$ ranging from 200Ω to 1 kΩ. As illustrated, NEP decreases with increase in the biasing current, and with increased source resistance Rs.

In addition, the Signal-to-Noise ratio (SNR) can be calculated as in Eq. (14). The SNR is proportional to the integration time $t_{int}$ and biasing current $I_D$ (i.e., doubling either one will increase the SNR by 3 dB). Larger source resistance $R_s$ (i.e., Increasing $H(\omega_0 R_s C_1)$ factor) may provide an additional increase in SNR:

$$SNR = 20\log_{10}\left(\frac{\frac{I_d t_{int}}{C_{INT}}}{\frac{\sqrt{qI_D t_{int}}}{C_{INT}}}\right) = \quad (14)$$

$$20\log_{10}\left(\left(J_0\left(j\frac{H(\omega_0 R_s C_1) V_0}{V_T}\right) - 1\right)\right) + 10\log_{10}\left(\frac{I_D t_{int}}{q}\right)$$

It can be seen from Eqs. (13) and (14) that neither of NEP and SNR depends on the integration capacitance $C_{INT}$, which provides a degree of freedom in choosing an optimal biasing current $I_D$ for a specific imaging application. For example, to achieve a background noise limited detection of a 100 GHz band centered around 220 GHz with an imaging system having telescope solid angle of 0.3 and detector area of 375 μm² a suitable detector's NEP would be around 3 pW/$\sqrt{\text{Hz}}$. From the noise requirement, an optimal biasing current can then be calculated (e.g., $I_D$=1 μA from FIG. 10).

Certain Development and Experimental Results are discussed next. Different topologies using CMOS technology such as common source amplifier, source-follower amplifier, and differential amplifiers can be simulated using Synopsys TCAD tool suite and Linear Technology Spice simulator. Experiments can test the responsivity of each of the circuit models to THz radiation as well as physical changes in the MOS transistors with and without terahertz excitation. Simulations can be run using 0.35 micron CMOS technology models. Simulation results have been found in agreement with values predicted in references (3-7), where it has been shown that the propagation and rectification of overdamped plasma waves in MOS transistor's channel can be used to detect THz radiation in standard CMOS.

Figure 11:
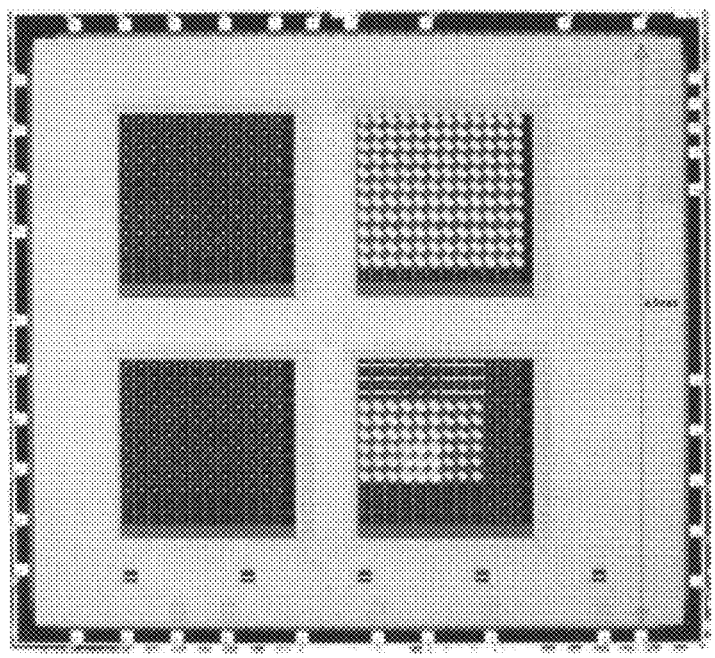
FIG. 11 illustrates a CMOS integrated circuit with four individually addressable THz detector arrays according to some embodiments.
Figure 12:
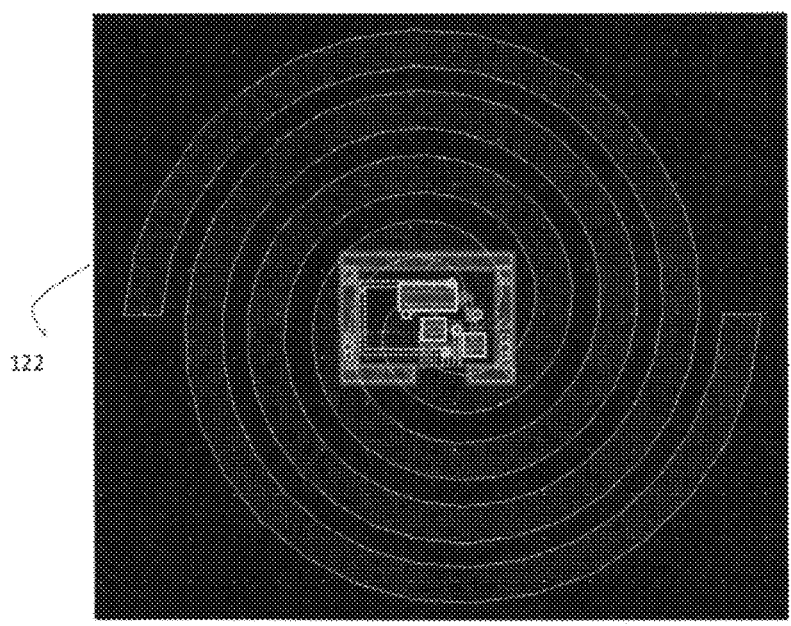
FIG. 12 illustrates the layout of an antenna cell including a linear-spiral antenna and a MOSFET THz detector in common-source topology according to some embodiments.

Concurrent with extensive simulations investigating the use of different CMOS circuit topologies for the purpose of detecting THz signal for THz imaging applications, a large number of design variations can be designed for a specialized THz focal plane array (FPA) with an integrated antennae matrix and imaging chain. Prototype chips can be fabricated in 0.35 μm CMOS technology through MOSIS, although this is only an example and other CMOS technologies can be used. Each chip of an example of a prototype contains four imaging arrays with 12×12 pixels totaling more than two hundred variations in terms of MOSFET detector size (W/L) coupled to different antennae (bow-tie, linear spiral, and log-spiral antennae) in order to characterize the responsivity to THz excitation and noise performance. FIG. 11 shows a micrograph of one of the prototype chips and layout of one of the pixels, and FIG. 12 shows a magnified view of one of the detector pixels with linear spiral antenna 120-122, which pixel can comprise a circuit as shown in FIGS. 1a, 3, 5, or 7-9. In FIG. 11, each of the four rectangles that are within the large rectangle is an array of 12×12 pixels, each comprising an example of the detector circuits discussed above. For readout purposes, the individual detectors forming the array can be connected to respective readout gating transistors operated in a manner similar to the readout mode of thin-film transistor (TFT) flat-panel x-ray detector (see. e.g., Goel, Ayush. "*Flat panel detectors*". Radiopaedia.org). Such array readout modes are known and for that reason need not be discussed in detail in this patent application.

Figure 13:
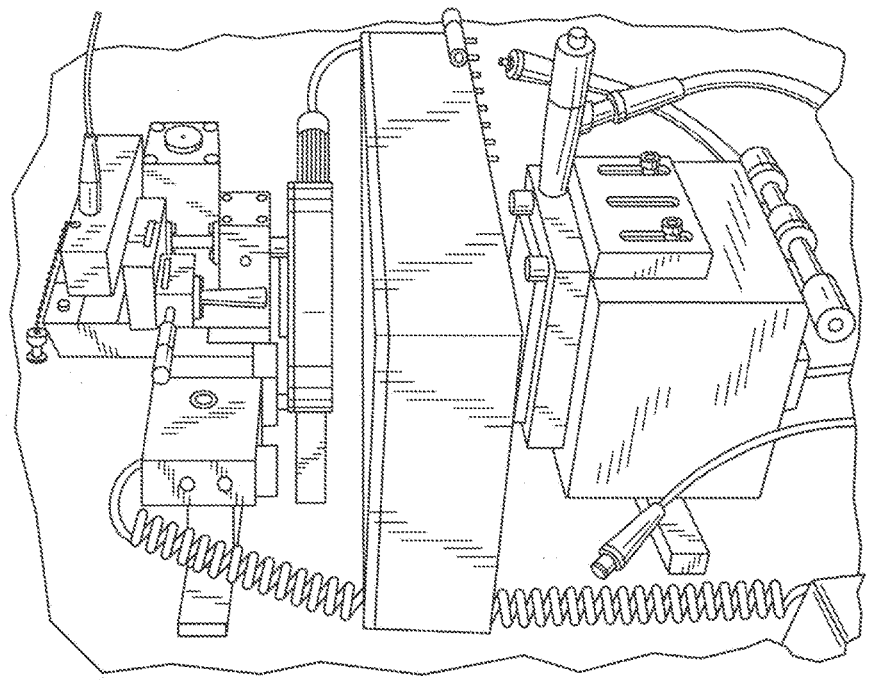
FIG. 13 illustrates an experimental arrangement using a Gunn diode source of THz radiation on the left, followed by a shutter, and a test enclosure mounted on XYZ and rotation stages for aligning a selected pixel of a MOSFET THz detector array with the THz source.
Figure 14:
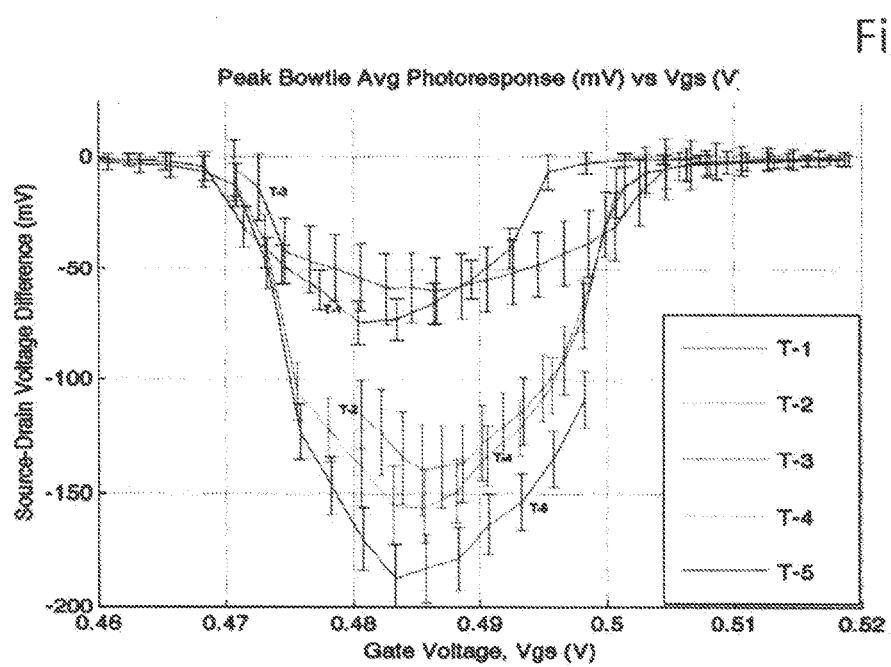
FIG. 14 illustrates a measured response to 188 GHz excitation signal for five examples of MOSFET device according to some embodiments.

For the purpose of reducing the measurement noise the prototype chips can be tested in an experimental setup such as illustrated in FIG. 13. The chips can be housed in an aluminum enclosure with an ultra-pure silicon window acting as a THz radiation filter. This can provide transmission in the THz region while blocking the wavelengths in the visible range. The chips can be irradiated by a 50 mW 188 GHz Gunn diode source from Virginia Diodes. Details of such an experimental setup and measurement techniques are discussed in reference [8]. As discussed in reference [8], a maximum responsivity of 40 kV/W can be measured with the MOSFET in a common-source topology operating in weak inversion (i.e., gate bias voltage below the threshold voltage) involving source diffusion region extension (as illustrate in FIG. 1b). Noise equivalent power (NEP) of 10 pW/sqrt(Hz) can be measured. In addition, it can be shown in such a setup that an increase in the length $L_s$ of the source diffusion region, which increases its resistance $R_s$, improves the response to THz radiation, as shown in FIG. 14. As compared to the best-reported responsivity values achieved in comparable CMOS technologies [9], the measured responsivity represents an order of magnitude improvement.

FIG. 14 illustrates the response to 188 GHz excitation signal for five MOSFET detectors (T1-T5) of the type illustrated in FIGS. 1a and 1b, each with bow-tie antenna, as a function of the biasing voltage $V_{gs}$. The MOSFETs have the same channel dimensions (2 μm/0.35 μm), but different source diffusion lengths (0.1 μm, 0.6 μm, 1.1 μm, 1.86 μm, and 2.1 μm). The measurement results indicate that the source extension helps increase the responsivity without much noise penalty. T-3 is the exception, which could be due to impedance mismatch, substrate defects, or testing error.

While several embodiments are described, it should be understood that the new subject matter described in this patent specification is not limited to any one embodiment or combination of embodiments described herein, but instead encompasses numerous alternatives, modifications, and equivalents. In addition, while numerous specific details are set forth in the description in order to provide a thorough understanding, some embodiments can be practiced without some or all of these details. Moreover, for the purpose of clarity, certain technical material that is known in the related art has not been described in detail in order to avoid unnecessarily obscuring the new subject matter described herein. It should be clear that individual features of one or several of the specific embodiments described herein can be used in combination with features or other described embodiments. Further, like reference numbers and designations in the various drawings indicate like elements. Thus, various modifications may be made without departing from the spirit and scope of the new methods and systems described in this patent specification. Accordingly, the scope of this patent specification is not limited to the above-described embodiments, but instead is defined by the claims of a patent to issue thereon in light of their full scope of equivalents.

REFERENCES

[1] D. Schroeder, *Modelling of Interface Carrier Transport for Device Simulation*, Wien: Springer, 1994.
[2] A. Ortiz-Conde*, F. J. Garcia Sanchez, M. Guzman, "Exact analytical solution of channel surface potential as an explicit function of gate voltage in undoped-body MOSFETs using the Lambert W function and a threshold voltage definition," Solid-State Electronics Volume 47, Issue 11, November 2003, Pages 2067-2074.
[3] Dyakonov, M. I.; Shur, M. S., "Plasma wave electronics: novel terahertz devices using two dimensional electron fluid," *Electron Devices, IEEE Transactions on*, vol. 43, no. 10, pp. 1640, 1645, October 1996.
[4] Dyakonov, M. I., "Generation and Detection of Terahertz Radiation by Field Effect Transistors", *Comptes Rendus Physique*, v. 11, iss. 7-8, p. 413-420.
[5] F. Schuster et al., "A Broadband Terahertz Imager in a Low-cost CMOS Technology," IEEE Int. Solid-State Circuits Conf. (2011).
[6] A. Lisauskas, U. Pfeiffer, E. Öjefors, P. Haring Bolivar, D. Glaab, and H. G. Roskos, "Rational design of high-responsivity detectors of terahertz radiation based on distributed self-mixing in silicon field-effect transistors," J. Appl. Phys. 105, 114511 (2009).
[7] Boppel, Sebastian; Lisauskas, Alvydas; Krozer, Viktor; Roskos, Hartmut G, "Towards monolithically integrated CMOS cameras for active imaging with 600 GHz radiation," Proceedings of SPIE, Volume 8261, issue 1, February 2012.
[8] G. J. Fertig, Z. Ninkov, M. F. Bocko, J. Dayalu, K. D. Fourspring, E. J. Ientilucci, Z. Ignjatovic, P. K. Lee, C. W. McMurtry, J. D. Newman, J. L. Pipher, A. P. Sacco, C. Zhang, "T-Ray Detection in 0.35 um CMOS Technology", Proc. of SPIE 2014.
[9] Schuster, F., Coquillat, D., Videlier, H., Sakowicz, M., Teppe, F., Dussopt, L., Gi_ard, B., Skotnicki, T., and Knap, W., "Broadband terahertz imaging with highly sensitive silicon CMOS detectors," Opt. Express 19, 7827{7832 (April 2011).

The invention claimed is:
1. A detector of terahertz (THz) energy configured to operate in a thermionic emission mode and comprising:
 a MOSFET having an extended source region, a channel region controlled by a gate, and a drain region;
 a gate-to-source voltage source configured to deplete the channel region of free carriers thereby placing the MOSFET in a sub-threshold voltage state; and
 said MOSFET being configured to operate in said thermionic emission mode to provide an output that is a measure of THz energy supplied to the gate.
2. The detector of claim 1 in which the output is an exponential function of the THz energy supplied to the gate.
3. The detector of claim 1 in which the output increases with increase of a size of the source region.
4. The detector of claim 1 in which the output increases with increase of a resistance of the source region.
5. The detector of claim 1 further including at least one THz antenna responsive to said THz energy and coupled with said gate.
6. The detector of claim 1 further including additional MOSFETs arranged in a detector array and configured to provide an image of an object traversed by or emitting the THz energy.
7. The detector of claim 1 in which the MOSFET is configured to operate in a photo-voltaic readout mode in which the detector output is integrated over selected time intervals to form a time succession of integrated detector output signals.
8. The detector of claim 1 including a readout resistor configured to convert drain-source current of the MOSFET to an output voltage.
9. The detector of claim 1 further including a communication network configured to supply information-modulated THz energy to the detector.
10. The detector of claim 1 in which the MOSFET is configured to provide spectral information regarding the THz energy.
11. The detector of claim 1 including a self-biasing circuit connecting the MOSTET's gate and drain and configured to increase a dynamic range of the detector.
12. A detector of terahertz (THz) energy comprising:
 a transistor having an extended source region, a channel region controlled by a gate, and a drain region;
 a gate-to-source voltage source configured to deplete the channel region of free carriers thereby placing the transistor in a sub-threshold voltage state; and
 said transistor providing an output that is an exponential function of THz energy supplied to the gate while the transistor is in said sub-threshold voltage state.
13. The detector of claim 12 in which the output increases with increase of a resistance of the source region.
14. The detector of claim 12 further including at least one THz antenna responsive to said THz energy and coupled with said gate.
15. The detector of claim 12 further including additional transistors arranged in a detector array and configured to provide an image of an object traversed by or emitting the THz energy.
16. The detector of claim 12 further including a communication network configured to supply information-modulated THz energy to the detector.
17. The detector of claim 12 in which the transistor is configured to provide spectral Information regarding the THz energy.
18. The detector of claim 12 including a self-biasing circuit connecting the transistor's gate and drain and configured to increase a dynamic range of the detector.
19. The detector of claim 12 including an additional transistor having a drain, source, and gate and responsive to THz energy supplied to its gate to provide an output that is an exponential function of THz energy supplied to its gate, wherein the drains of the two transistors are coupled to each other.

20. An THz energy imaging system comprising:
an array of transistors each having an extended source region, a channel region controlled by a gate, and a drain region;
a gate-to-source voltage source configured to deplete the channel region of each of the transistors in the array of free carriers thereby placing each of the transistors in a sub-threshold voltage state; and
each of said transistor providing a respective output that is an exponential function of THz energy supplied to its gate while the transistor is in its sub-voltage state.

* * * * *